(12) United States Patent
Slechta et al.

(10) Patent No.: US 6,788,987 B2
(45) Date of Patent: Sep. 7, 2004

(54) SYSTEM AND PROCESSES FOR PERFORMING QUICK CHANGEOVERS ON ASSEMBLY LINES

(75) Inventors: Scott Slechta, Duluth, GA (US); Juan Vasquez, Guadalajara (MX); Mari Merwin, Lawrenceville, GA (US)

(73) Assignee: Siemens Electronic Assembly Systems, Inc., Norcross, GA (US)

( * ) Notice: Subject to any disclaimer, the term of this patent is extended or adjusted under 35 U.S.C. 154(b) by 506 days.

(21) Appl. No.: 09/915,157

(22) Filed: Jul. 25, 2001

(65) Prior Publication Data

US 2002/0124394 A1 Sep. 12, 2002

Related U.S. Application Data

(60) Provisional application No. 60/274,304, filed on Mar. 7, 2001.

(51) Int. Cl.$^7$ .............................. G06F 19/00; G09G 5/00
(52) U.S. Cl. ........................ 700/106; 345/705; 345/708; 345/709
(58) Field of Search ........................... 700/95, 97, 105, 700/106, 83, 117, 121; 345/700, 705–715; 434/72, 107, 108, 219, 224, 369, 428, 430

(56) References Cited

U.S. PATENT DOCUMENTS

| | | | | |
|---|---|---|---|---|
| 5,553,376 A | * | 9/1996 | Solanki et al. ................ | 29/833 |
| 5,771,043 A | * | 6/1998 | Nigawara et al. ............ | 345/419 |
| 6,224,385 B1 | * | 5/2001 | Nitta et al. .................. | 434/219 |
| 2002/0051008 A1 | * | 5/2002 | Mathis et al. ................ | 345/705 |
| 2003/0196312 A1 | * | 10/2003 | Moore et al. ................. | 29/430 |

* cited by examiner

Primary Examiner—Leo Picard
Assistant Examiner—Ryan Jarrett

(57) ABSTRACT

An improved method for instructing how to most efficiently effect a product changeover on an assembly line includes the steps of providing an instructional animation which schematically shows the steps which are to be taken by a plurality of workers to effect the changeover. Preferably, the animation is a computer animation, and includes color-coded representations of the various workers and the steps that should be taken in a particular sequence. Preferably, the workers are also provided with instructional badges which could be carried by the workers, and which are also color-coded. The animation will also include access to these color-coded instruction to provide further feedback to both the worker, and the supervisory personnel of the steps an individual worker should be taking during a particular point in the assembly in changeover. Further, the present invention includes a method of identifying a required changeover time including the steps of preparing a table showing the number of components which need to be changed, and then providing an identification of the required time for that particular changeover. The components are all preferably used in combination in a method of changing over an assembly line.

15 Claims, 17 Drawing Sheets

| | |
|---|---|
| Operate top side equipment until last PCB enters Siplace equipment | 👤3 👤4 — 38 |
| Insures last PCB exits all top side processes | 👤3 |
| Adjust conveyor width between Siplace machines & oven | 👤3 |
| Adjust conveyor width after the oven | 👤3 |
| Operate Siplace machines as first PCB is passed through top side | 👤3 |
| Maintain operating machines through rest of changeover | 👤4 |
| Prepare screen printer for changeover | 👤4 |
| Assist line tech with screen printer | 👤4 |
| Adjust conveyor width between screen printer & Siplace machine | 👤4 |
| Assist maintenance tech with screen printer | 👤4 |
| Operate screen printer as first PCB is passed through top side | 👤4 |
| Operate screen printer through rest of changeover | 👤4 |

*Fig-6C*

| Assist the Line Tech with the program for the bottom side screen printer | [icon 2] — 46 |
| Assist the Line Tech with the program for the top side screen printer | [icon 2] |
| Assist the Line Tech with any issues regarding the changeover | [icon 2] |
| Change program for the bottom side screen printer | [icon 1] — 44 |
| Change bottom side program on the line computer | [icon 1] |
| Adjust conveyor width, verify the last PCB has exited the oven | [icon 1] |
| Change the bottom side oven profile | [icon 1] |
| Change top side program on the line computer | [icon 1] |
| Change program for the top side screen printer | [icon 1] |
| Change the top side oven profile | [icon 1] |
| Address any issues regarding the changeover | [icon 1] |

*Fig-6D*

[icon 1] — 44

| Verify that the last PCB has exited the Siplace machines |
| Check nozzle configuration for the new setup on bottom side |
| Check nozzle configuration for the new setup on top side |
| Assist on any issues regarding the changeover |

*Fig-6E*

SYSTEM AND PROCESSES FOR PERFORMING QUICK CHANGEOVERS ON ASSEMBLY LINES

This application claims priority to provisional patent application Ser. No. 60/274,304 filed Mar. 7, 2001, entitled "Method and Systems for Modifying the Manufacture or Assembly of Electronic Devices and Systems".

BACKGROUND OF THE INVENTION

In general, this application relates to procedures and processes for the most efficient changeovers between different product families.

An electronics assembly line is an integrated system of process equipment, pick-&-place equipment, board handling units, inspection machines, and software which allows communication between all the pieces. A pick-&-place equipment has a function of mounting electronics components onto printed circuit boards. Each electronics product has a number of common parts but may also require distinct parts. In modern electronics, the products have a number of common parts across product lines, but each style and type of product will also have distinct parts. In-modern electronics, the product shave a number of common parts across product lie but each style and type of product will also have distinct parts.

One type of automated assembly line equipment is surface mount technology or SMT equipment. Such equipment is equipped with a set number of feeder tables which in turn hold component feeders. Each feeder supplies a distinct type of part to a robotic mounter.

When a new setup is introduced to a production line different sets of feeders must be assembled and loaded onto the tables to supply different types and quantity of components.

The Assignee of the present application utilizes a software tool to optimize the changeover process once the programs, priorities and constraints are fed in advance. A good deal of work has gone into making the changeover between products more efficient. As an example, for years the Assignee of the present application has utilized a computer program to optimize the feeder tables and feeders which are switched between any two product families being manufactured. Many factors are taken into consideration by the optimization program, including an attempt to minimize the numbers of tables and feeders which must be changed. The optimizer is capable of identifying the required changes in feeders and feeder tables with the least frequencies to build numerous product families.

In designing a changeover, the computer program will attempt to minimize the number of feeder tables that will need to be changed by making as many of the feeder tables as possible uniform across product families. The program may attempt to identify tables which could be made uniform by having common parts for any number of different product families included in common feeder tables.

However, the software tool by itself is not sufficient to achieve the quickest changeovers due to the human factor. Thus, the prior art has attempted to make the process of changing over the assembly of two components as systematic as possible. However, certain deficiencies still exist. Production staff assigned to perform these changes on the SMT lines must be trained on the most efficient process. Moreover, the process engineer is unable to predict the approximate time for each changeover. To date, no equipment vendor or production consultant has developed a training tool tying the shortest possible changeover time with the most efficient changeover procedures. Particularly in an industry where every manufacturer is suffering from shortages of qualified workers and high turnover rate, it is critical to develop such a tool to improve business performance. However, to date, no way of predicting the necessary time for a change, nor in tying that time to the steps that should be taken at any one time has been provided.

SUMMARY OF THE INVENTION

In disclosed features of this invention, a method of performing quick changeovers on assembly lines between the manufacture of various product families incorporates a number of training steps. An instructional visual tool is created for the workers who will be performing the changeovers describing the steps each worker should be taking in sequence.

The set of instruction should be reviewed by every production staff assigned to the line from line supervisor to changeover technicians prior to any changeover to implement the process correctly. This can be viewed by all of the workers prior to beginning the changeover, and can also be reviewed by supervisory personnel during the changeover to ensure the changeover is proceeding in the right order. Moreover, this visual tool is preferably provided with a timeline that will provide feedback of whether the steps are taking place at the proper time and in the proper order.

In other features of this invention, a method is provided to predict changeover time. The method identifies the required changes in feeders and feeder tables based upon matrixes of the common and unique parts for the planned productions. The procedure also creates a matrix of loading-feeder time for each product family. Once the Charts are created, it is possible for Process Engineer to calculate approximate time for each changeover. This approximate time can also be utilized in the visual tool described above in order to more accurately create the timeline.

In yet another feature, each changeover technician is provided with a badge indicating the changeover steps, for example, which feeder table to be changed how and when. Though the badge can be unique to each changeover, it could also include common or generic steps. instructions, and a chart for identifying the approximate time necessary for a particular changeover are all disclosed. Further, this invention extends to the combination and sub-combinations of each of these individual components.

These and other features of the present invention can be best understood from the following specification and drawings, the following of which is a brief description.

BRIEF DESCRIPTION OF THE DRAWINGS

FIG. 6C is a third badge.

FIG. 6D is a fourth badge.

FIG. 6E is a fifth badge.

FIG. 7I is a ninth screen in an ongoing visual tool.

DETAILED DESCRIPTION OF A PREFERRED EMBODIMENT

Figures 1, 2, 3:
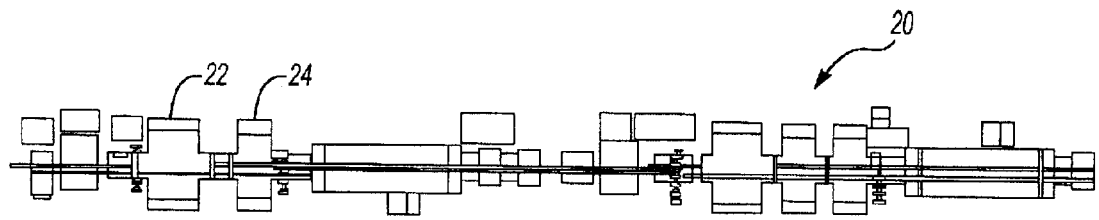
FIG. 1 is a schematic view of an electronic assembly line.
FIG. 2 shows a plurality of matrixes which provide information about the changeover between distinct parts.
FIG. 3 is a timing table which is a part of the present invention.

An electronics assembly line 20 is illustrated in FIG. 1 schematically, As is known, a line of integrated equipment automatically insert and mount a number of pants onto printed circuit boards. A single assembly line 20 can be utilized to manufacture a number of distinct products. As an example, a single assembly line could manufacture distinct products such as cell phones and personal data assistants. Further, on any one assembly line you could produce a number of distinct models for any type of product category such as distinct models of cell phones. Various types of feeder tables such as shown at 22 and 24 hold feeders that can supply electronic components to assembly equipment.

In the present invention, one main feature is providing an approximation of the time it will take to change over the various feeders and feeder tables on the assembly line between any two products. For purposes of this application, a changeover between products would also extend to a changeover between models of a particular type of product such as distinct cell phone models.

Part of the present invention includes the initial development of a plurality of matrix tables such as shown at 26, 28 and 30. The invention includes identifying the number of common parts between any two systems which are to be assembled and the number of distinct parts. From matrix 26 and matrix 28, the number of distinct feeders which must be utilized, and the number of distinct feeder tables can also be developed. The chart 30 shows the number of minutes to load feeders.

Applicant has long used a computer program which assists in identifying steps to take to maximize the efficiency of changeovers by limiting the number of feeder tables and feeders which must be changed. Such systems are believed known in the art elsewhere, and a worker in this art would recognize the various steps which could be utilized to minimize the number of tables and feeders necessary to replace between any two products, particularly once the number of distinct and common parts are identified.

FIG. 3 shows a table 32 which charts minutes necessary for changeover once an operator has an identification for the number of feeder tables which need to be replaced and the number of feeders on the feeder tables. From this chart an approximation of the time necessary for a changeover can be developed. This chart is one inventive aspect of this application. To date, process engineers have guessed at the required changeover time, and chart 30 provides a more accurate approximation of the changeover time.

Figure 4:
FIG. 4 is a Gantt chart for a particular line changeover.

FIG. 4 shows a Gantt chart 34 of the number of steps which a number of individuals need to take during a changeover. Such charts are known in the art, and are often manufactured by process engineers to identify the steps which should be taken through a period of time to effect various processes in a factory environment.

Figure 5:
FIG. 5 is a color key for a plurality of badges which are part of this invention.

FIG. 5 shows a color code 36 for identifying badge color references for a number of operators who will be part of a line change. As an example, the icons 38, 40, 42, 44, 46, 48 and 50 arm each provided with distinct colors. Within any one color icon (i.e., 38) there could be a number of operators of that color.

Figure 6A:
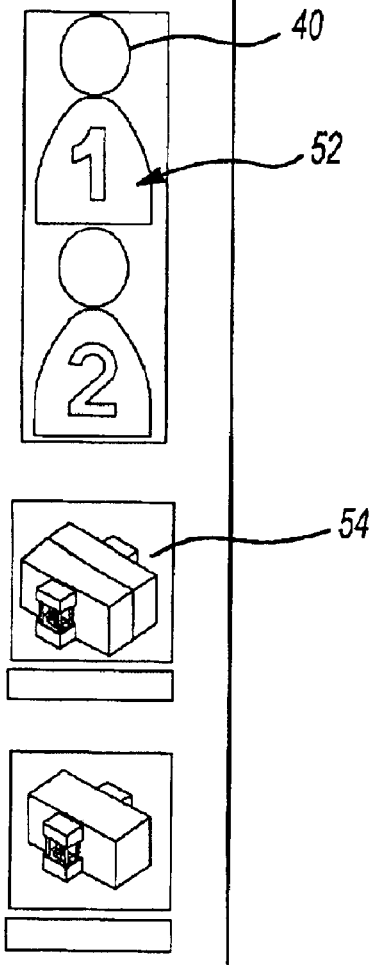
FIG. 6A is a first badge.

As shown in FIG. 6A, operators of a common color are provided with badges 52 which include the color icon 40, and may include visual identifiers such as shown at 54 to assist in identifying a particular type of feeder table. Instructions 56 for steps that are necessary during a changeover are also included on the badges. The individuals who are associated with the icons 40 are provided with these badges, and can turn to these badges to ensure proper instructions during any changeover. In a most preferred embodiment, the badges such as badge 52 are generally generic and will relate to any product change. Thus, the individuals identified by the icons 40 will tend to change feeder tables by the instructions shown at 56.

Figure 6B:
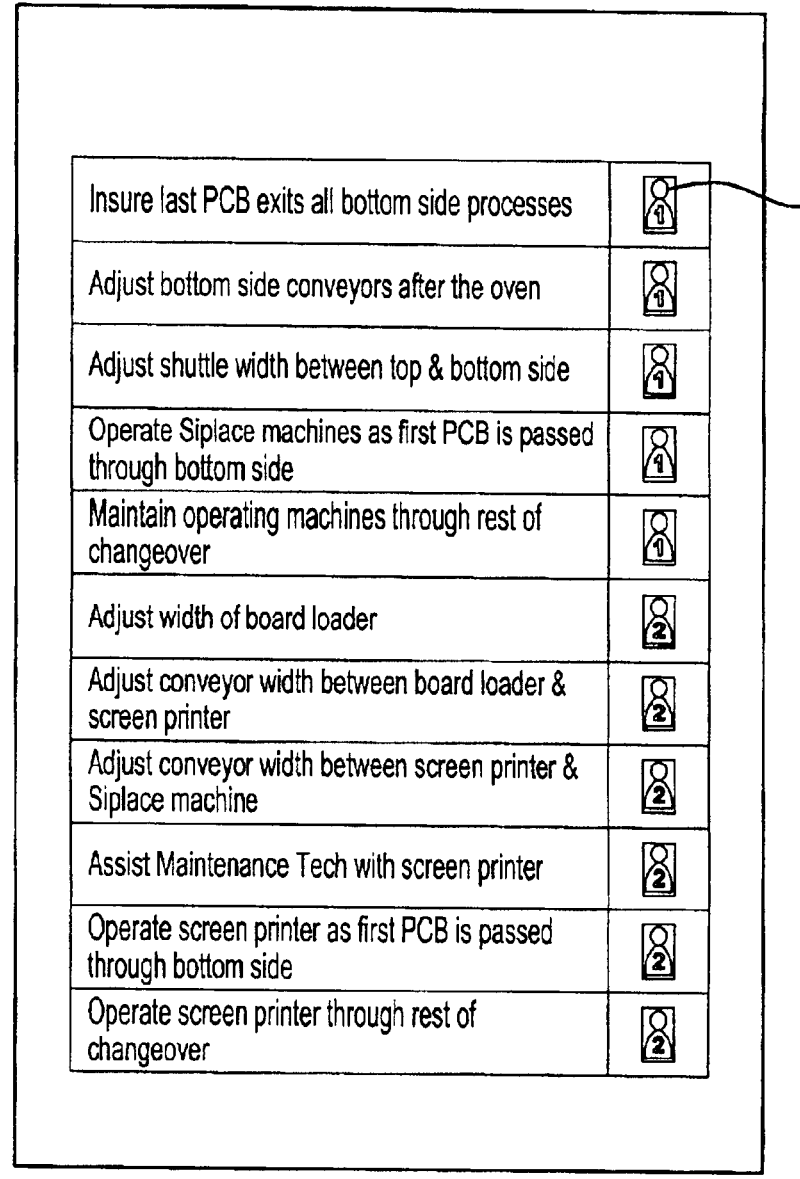
FIG. 6B is a second badge.

FIG. 6B shows another bade 58 for the workers identified by numbers 1 and 2 of the color icon 38. FIG. 6C shows a badge 60 for the workers identified by numerals 3 and 4 of the color icon 38.

FIG. 6D shows a badge 62 for the workers identified by the color icons 44 and 46.

Figure 6F:
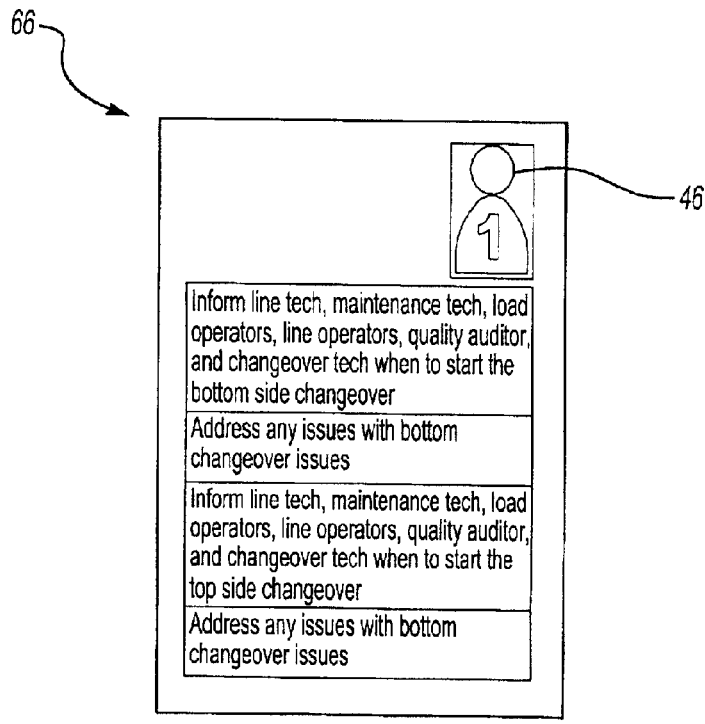
FIG. 6F is a sixth badge.

FIG. 6F shows a badge 66 providing instructions for a worker identified by the color icon 46.

Figure 6G:
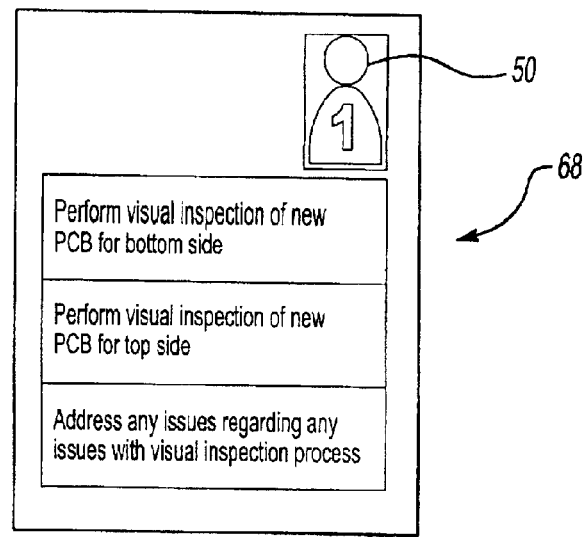
FIG. 6G is a seventh badge.

FIG. 6G shows a badge 68 for the worker identified by the color icon 50.

The badges are provided to the individuals on the assembly line to be utilized by these individuals during the changeover process. These badges provide another distinct feature of this invention. By providing these color coded instructions to each individual, each individual is provided with feedback of the steps that must be taken during a changeover.

Figure 7A:
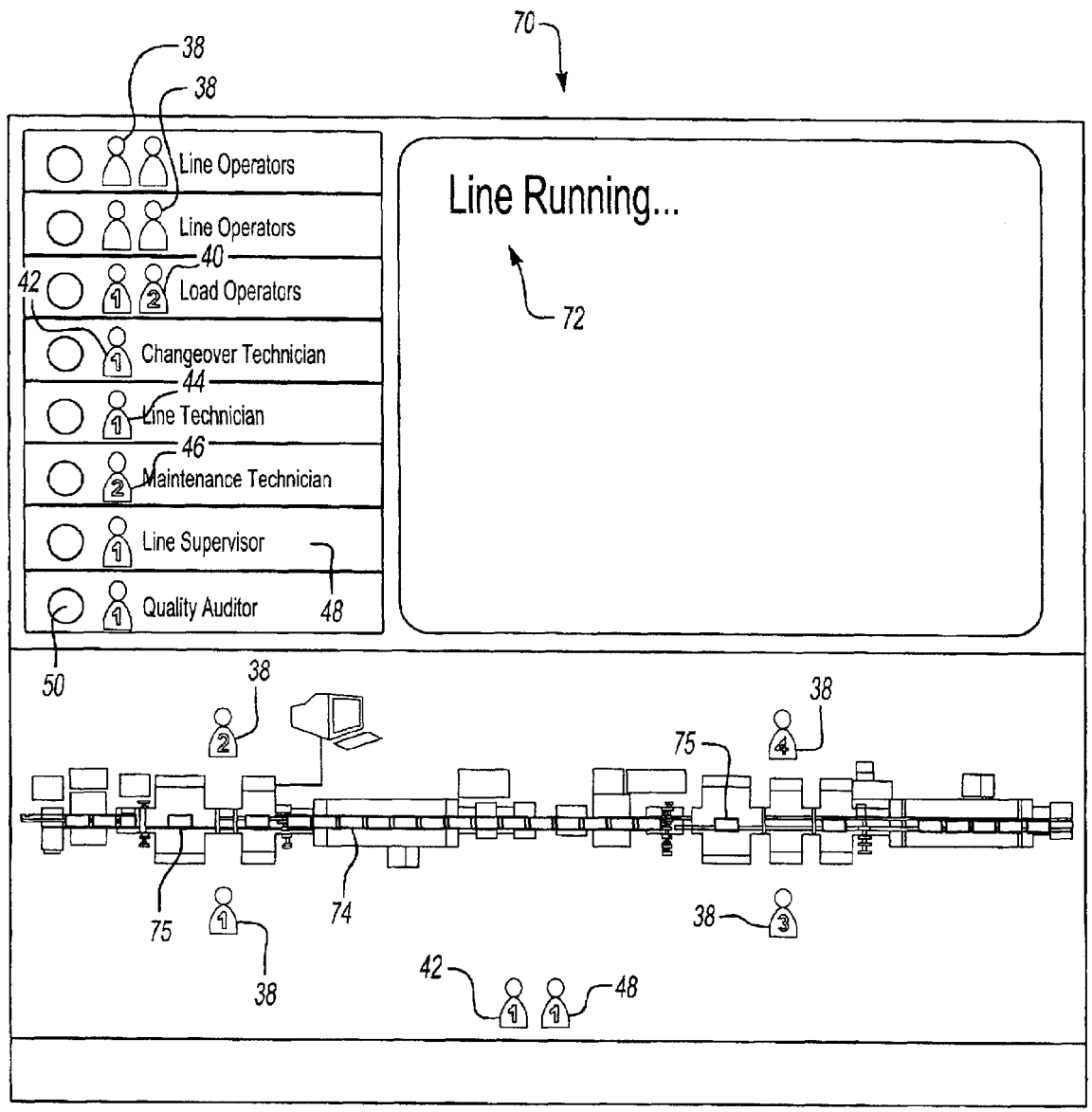
FIG. 7A is a first screen in an ongoing visual tool.

FIGS. 7A–7J show screen prints from a moving visual instructional animation 70 which provides instructions to workers on the line, and also provides feedback if necessary to those monitoring the changeover process. By the term "moving visual instructional animation", applicant does not intend to limit this to animations in the sense the term is typically utilized. Rather, the term could extend to any sort of visual instructional tool wherein there is movement shown between successive screens. An early screen animation 70 is shown in FIG. 7A. Commentary such as at 72 provides the state of the assembly line for the prior manufactured product which is to be changed. An assembly line 74 is shown schematically manufacturing prior products such as shown at 75. Various workers of various color coded icons are shown at various positions. Typically, this animation 70 would be watched by all workers prior to beginning a changeover such that the workers can identify the steps they should be taking during the changeover. Further, the animation 70 would typically be unique for any one changeover between a particular product and another product. Of course, if particular changes that need to be made are identical for two distinct changeovers, the animation could be the same.

Figure 7B:
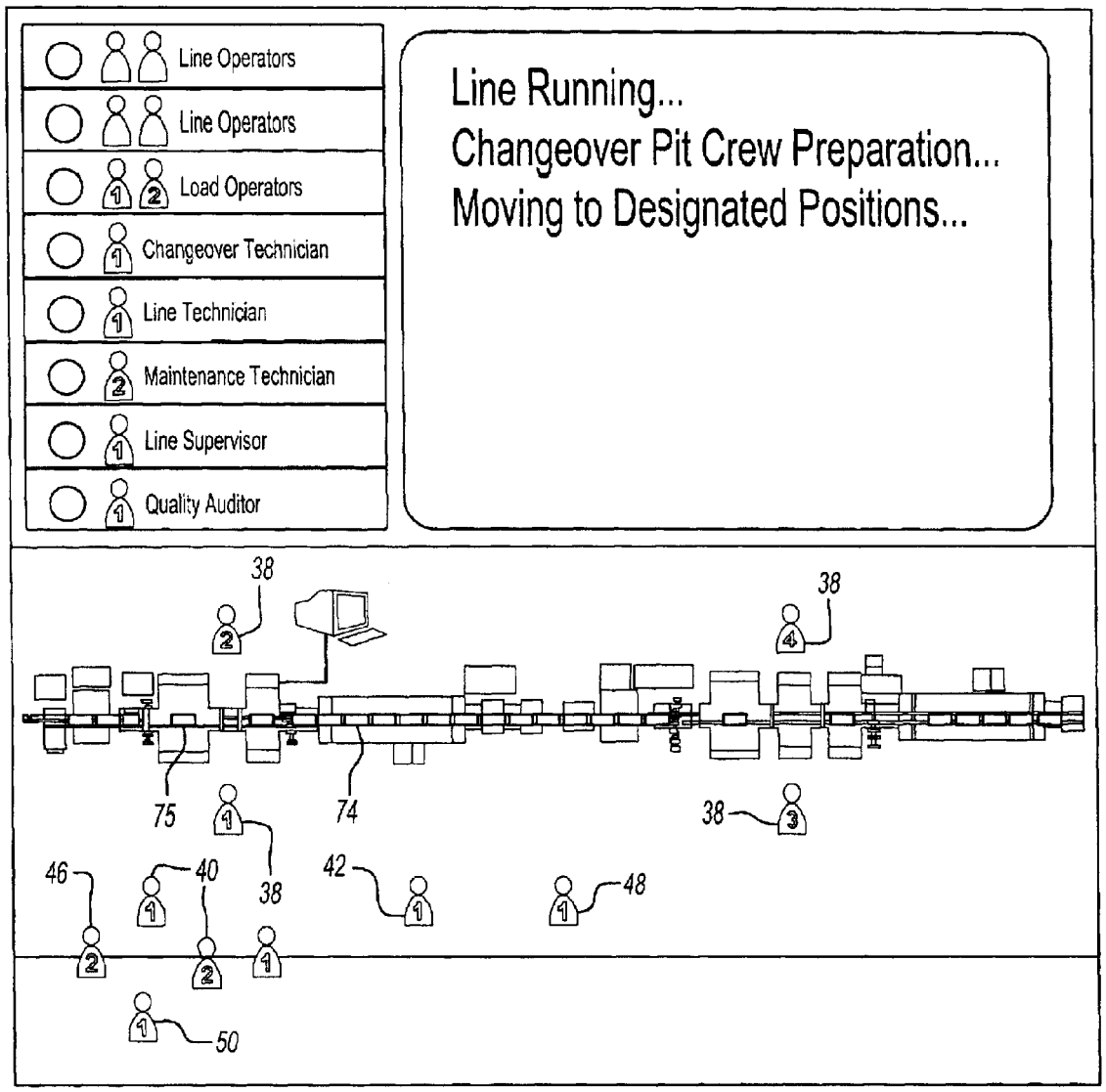
FIG. 7B is a second screen in an ongoing visual tool.

By the subsequent screen shown in FIG. 7B, further steps have occurred. A changeover pit crew has been assembled. Typically, it is preferred that the feeder tables which are to be replaced on the assembly line are filled and prepared at an off site location. In this way, room around the assembly line is not impacted by the preparation of the feeder tables. Moreover, in this way, the preparation of the new feeder tables does not create any down time or add to the changeover time. Of course, it is preferred that the amount of time the assembly line will be shut down between the manufacture of the two products be minimized. Thus, in FIG. 7B, various additional workers are shown at various preliminary positions, and moving to designated changeover positions.

Figure 7C:
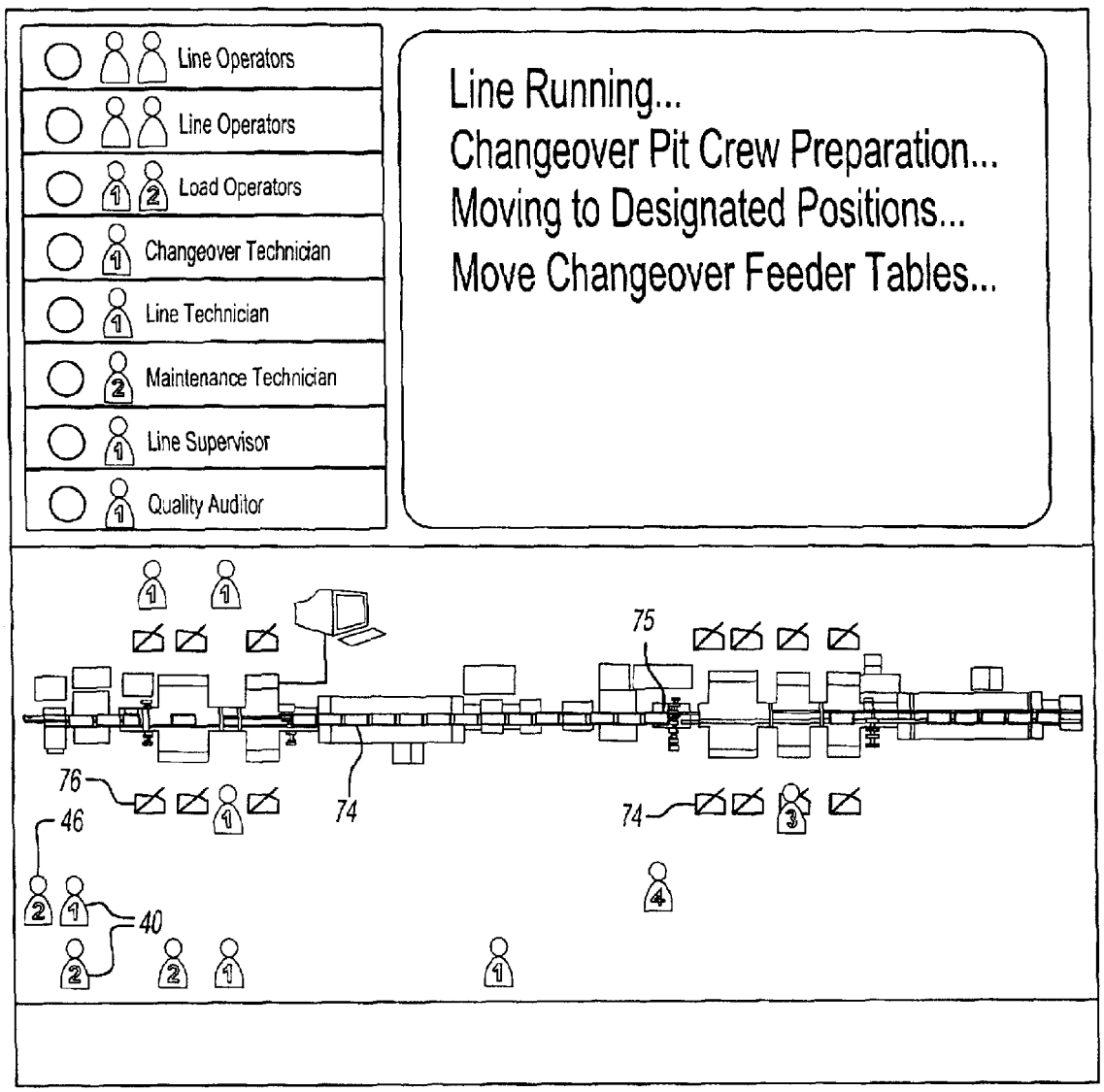
FIG. 7C is a third screen in an ongoing visual tool.

FIG. 7C shows a further screen wherein the feeder tables 76 which are to be changed are moved to positions adjacent the location of feeder tables which are to be removed. As can be seen, products 75 continue to be manufactured.

Figure 7D:
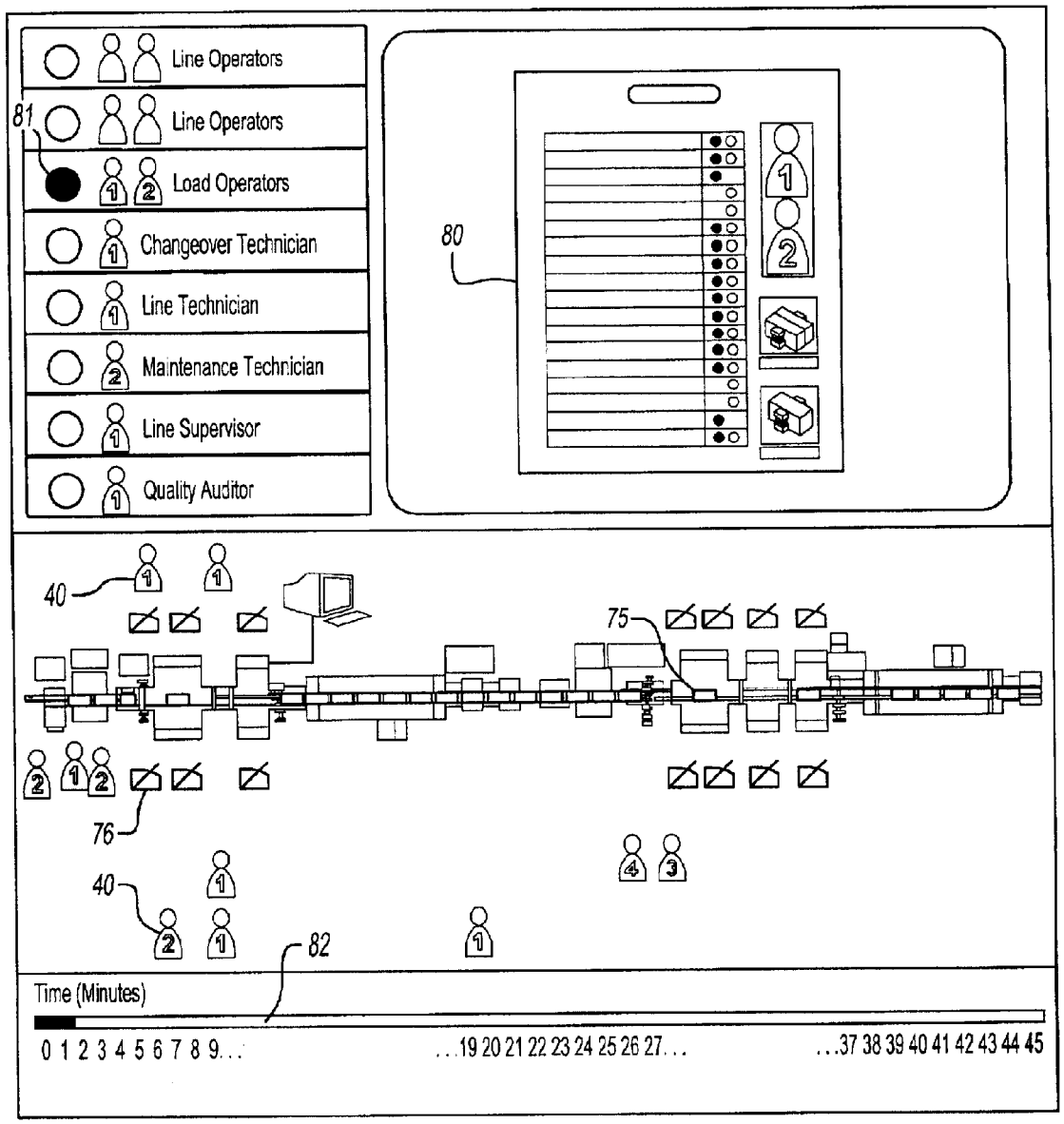
FIG. 7D is a fourth screen in an ongoing visual tool.

In the screen shown in FIG. 7D, the badges are represented at 80, and may be the badges such as shown before. Any one of the icons at 81 can be highlighted to provide the associated badge 80. Thus, while one of the icons has been highlighted and one of the badges has been provided, preferably the animation would be sophisticated enough such that the badges associated with any of the other icons could be highlighted and its associated badge would be shown at 80. To this end, sophisticated computer animation programs such as Macromedia Flash are preferably utilized to allow such modifications.

Figure 7E:
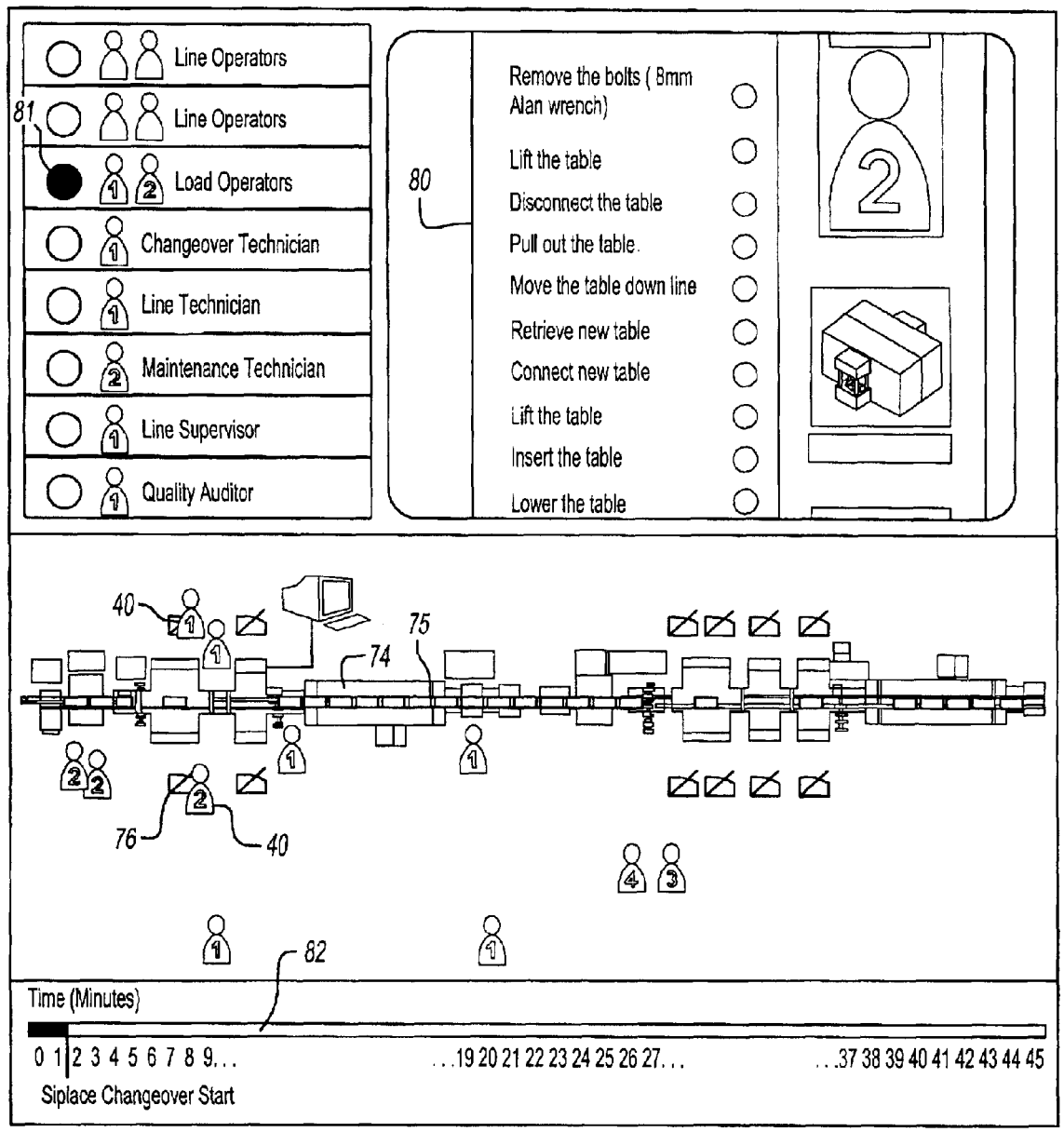
FIG. 7E is a fifth screen in an ongoing visual tool.
Figure 7F:
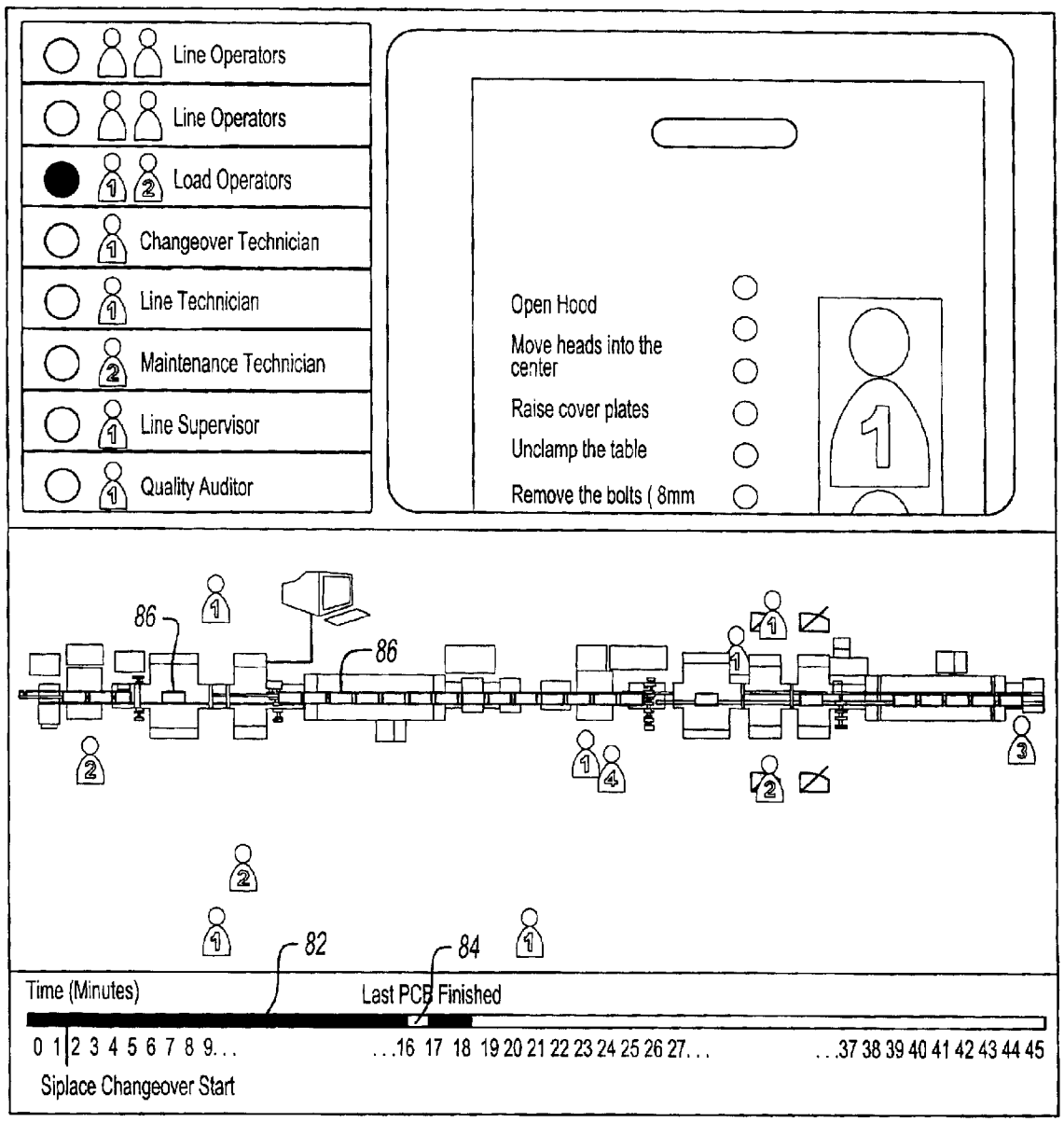
FIG. 7F is a sixth screen in an ongoing visual tool
Figure 7G:
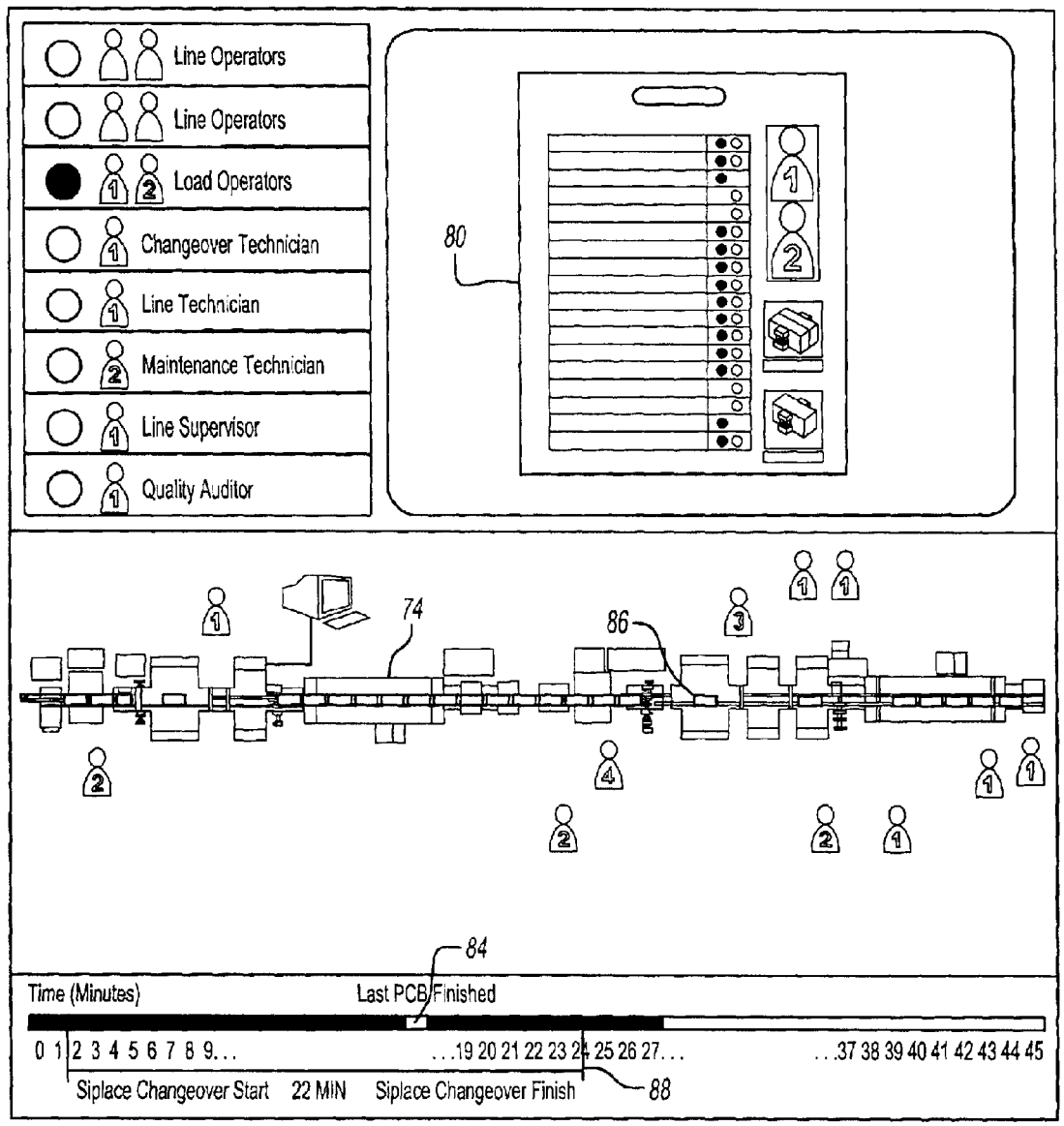
FIG. 7G is a seventh screen in an ongoing visual tool.
Figure 7H:
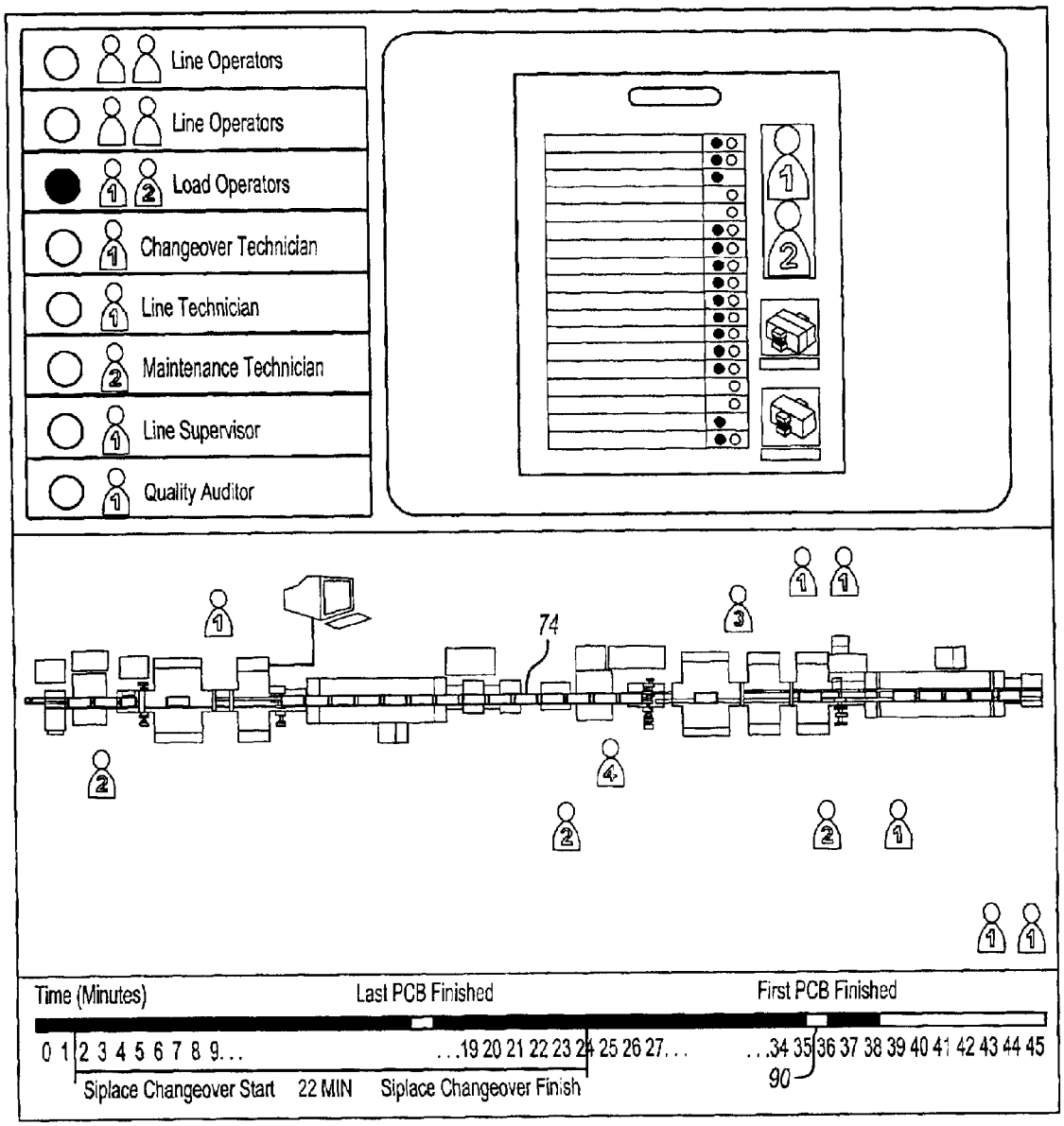
FIG. 7H is an eighth screen in an ongoing visual tool.
Figure 71:
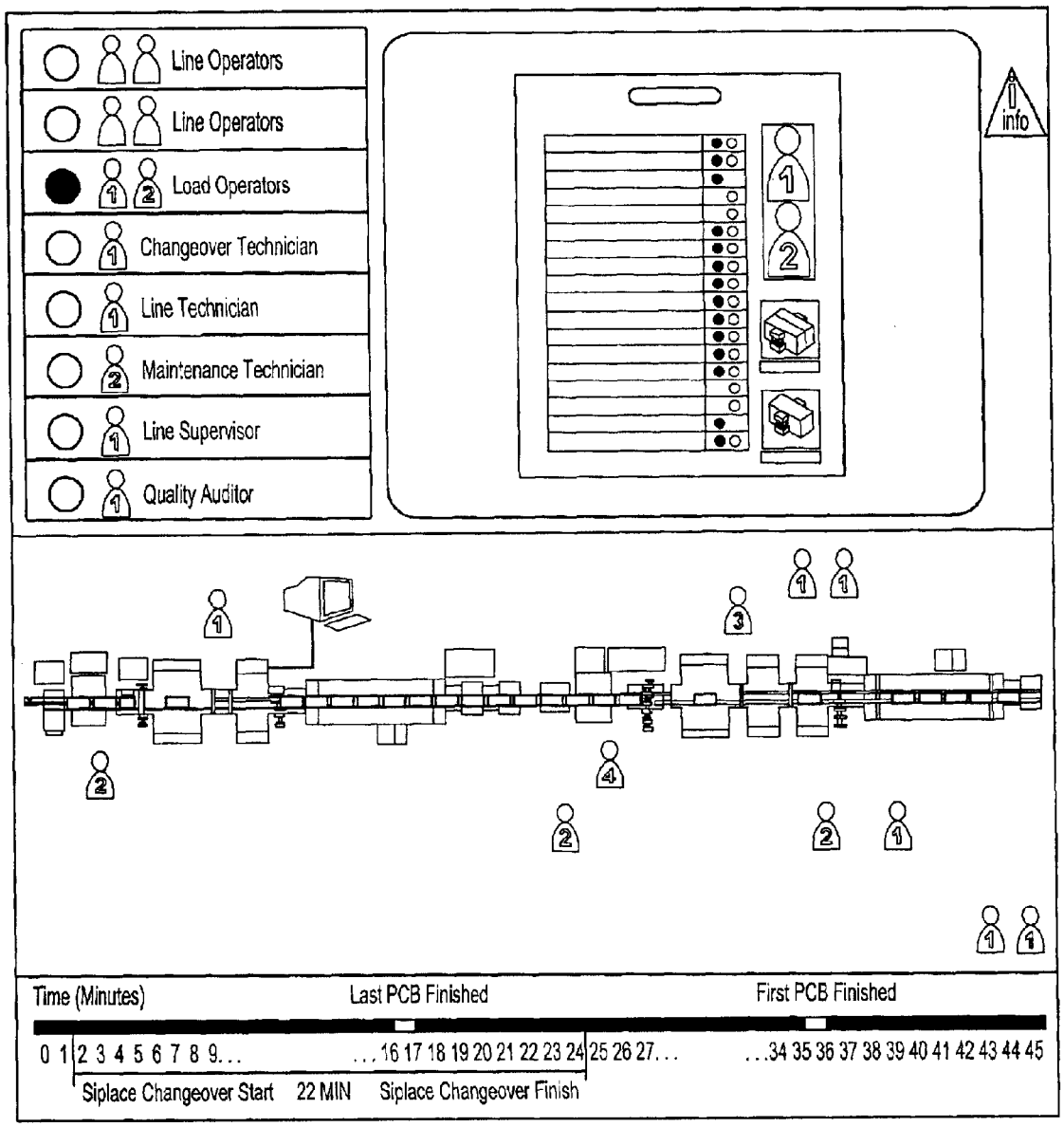
Figure 7J:
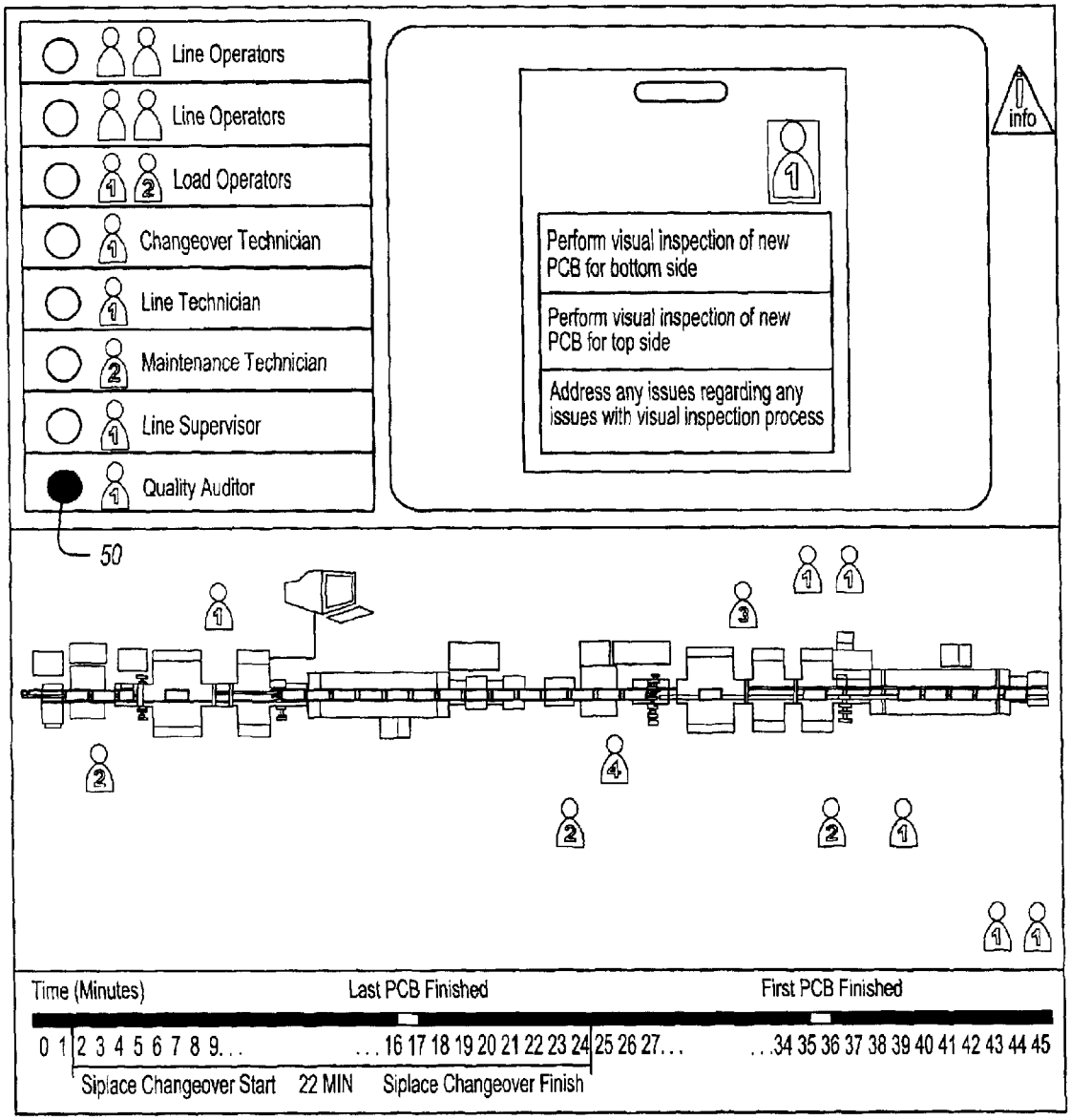
FIG. 7J is a temp screen in an ongoing visual tool.

FIG. 7J shows a screen which could be selected as an alternative to FIG. 7D, and in which the icon for the worker identified by 50 has been selected, such that the appropriate badge for that worker is highlighted.

In the screen shown at FIG. 7D a timeline 82 has now appeared on the screen. The timeline 82 will assist the various assembly workers in moving to the particular stations and making the particular changeovers in the proper timing sequence. Moreover, during the changeover process the timeline 82 will provide feedback to supervisory personnel of whether the changeover is proceeding in the proper order, and in a timely fashion.

FIG. 7E shows a further screen, wherein the workers are changing the feeder tables 76 have now moved to positions adjacent the feeder tables. The assembly line 74 is still making the prior product 75. manufactured. As can also be seen in FIG. 7F, the workers are still changing feeder tables adjacent a back end of the line.

As shown in FIG. 7G, the last of the prior products is identified at 84 on the timeline 82 and the first of the new products is identified at 86. The changeover is complete and the timeline illustrates this graphically at 88 since all of the tables have now been changed.

As shown in FIG. 7H, the first of the new products 86 has now left the line 74. As shown graphically at 90, the timeline will provide feedback that the first of the new products should be finished. The animation continues as shown at FIG. 7I to completion.

This invention thus provides a combined system and process for the most efficient changeovers between different product families on an assembly line. A moving visual instructional and feedback system is provided in the way of an animation. Preferably, the animation provides instructions to the various workers that the steps should be taken and in what order. More preferably the animation ties in the instructional badges, and the timelines as described above. The badges themselves are a separate feature of this invention, and provide instructions to each worker of the steps that should be taken during a changeover. Moreover, the preparation of the table which allows the prediction of the changeover time is also a separately patentable feature. Moreover, the method of changing over utilizing all of these components is itself inventive.

Although a preferred embodiment of this invention has been disclosed, a worker in this art would recognize that various modifications would come within the scope of this invention. For that reason the following claims should be studied to determine the true scope and content of this invention.

What is claimed is:

1. A method of changing an assembly line between the manufacture of two different products comprising the steps of:

1) identifying assembly line components which must be changed to effect a changeover at the assembly line between the manufacture of two different product;

2) preparing an animation showing steps which should be taken by a number of individuals associated with the changeover to effect the changeover, the animation showing movement and steps the individuals will need to make to complete the changeover; and 3) showing the animation to the individuals prior to the changeover to assist in providing instruction to the individuals of the movement and steps necessary during the changeover.

2. A method as set forth in claim 1, wherein the animation is unique for the changeover between two products.

3. A method as set forth in claim 1, wherein a timeline is provided alone with the animation to provide feedback of an order and timing for the particular steps involved in the changeover.

4. A method as set forth in claim 3, wherein the animation is utilized during the changeover to provide feedback on the changeover compared to a prediction of the time to complete the changeover.

5. A method of changing an assembly line between the manufacture of two different products comprising the steps of:

1) identifying assembly line components which must be changed to effect a changeover at the assembly line between the manufacture of two different products;

2) preparing an animation showing steps which should be taken by a number of individuals associated with the changeover to effect the changeover;

3) showing the animation to the individuals prior to the changeover to assist in providing instruction to the individuals of the steps necessary during the changeover; and 4) the animation including a representation of icons associated with each of the individuals involved in the changeover, and instructions for any one of the individuals are selectively provided as part of the animation.

6. A method as set forth in claim 5, wherein the animation is a computer animation, and the individuals may select an icon associated with each of the individuals to highlight the instructions for the particular individual.

7. A moving visual instructional animation comprising:

a schematic representation of an assembly line which is to be changed;

a number of visual icons associated with individuals who are to effect a changeover, the visual icons moving through a sequence of steps which are to be taken during the changeover to effect the changeover; and a timeline provided as part of the animation to provide instruction of a timing for each of the steps.

8. An animation as set forth in claim 7, wherein the animation is provided as a computer animation.

9. An animation as recited in claim 7, wherein the icons are color-coded icons having representations distinct for several of the individuals.

10. An animation as recited in claim 9, wherein different instruction sheets are provided within the animation and are coded to the coding provided for each of the individuals such that the individuals can review the instruction sheets.

11. A system for instructing a plurality of individuals in a changeover comprising:

an animation showing steps to be taken during a changeover, said animation including a schematic representation of an assembly line, and said animation including a number of representations of the individuals who are to effect the changeover, the representations of the individuals being coded such that distinct individuals can identify themselves in the animation; and said animation also including representations of instruction sheets to be carried by the individuals, the instruction sheets being coded to the coding of the representations of the individuals in the animation.

12. A system as set forth in claim 11, wherein the representations and the sheets are color-coded for the individuals.

13. A system as set forth in claim 11, wherein a timeline is included in the animation and shows the steps to be taken at particular periods of time during the changeover.

14. A system as set forth in claim 13, wherein the timeline further shows a representation of when a last unit of a prior products should be manufactured and the first unit of a new products should be manufactured.

15. An instructional system for providing instructions to a plurality of individuals on an assembly line comprising:

a plurality of color-coded instructions, each of the color-coded instructions being provided with instructional steps which are to be taken by the individual during a changeover; and each of the individuals on a changeover being associated with a particular color coding and provided with a badge, the color-coded instructions being provided to the individual based upon the individual's associated color coding.

* * * * *